US011202351B2

(12) United States Patent
Dimberg et al.

(10) Patent No.: US 11,202,351 B2
(45) Date of Patent: Dec. 14, 2021

(54) CONTROL DEVICE FOR CONTROLLING MULTIPLE OPERATING CHARACTERISTICS OF AN ELECTRICAL LOAD

(71) Applicant: Lutron Technology Company LLC, Coopersburg, PA (US)

(72) Inventors: Chris Dimberg, Easton, PA (US); Daniel L. Twaddell, Allentown, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 105 days.

(21) Appl. No.: 15/612,027

(22) Filed: Jun. 2, 2017

(65) Prior Publication Data

US 2017/0354022 A1 Dec. 7, 2017

Related U.S. Application Data

(60) Provisional application No. 62/356,288, filed on Jun. 29, 2016, provisional application No. 62/345,449, filed on Jun. 3, 2016.

(51) Int. Cl.
*G05D 23/19* (2006.01)
*H03G 3/04* (2006.01)
(Continued)

(52) U.S. Cl.
CPC ............. *H05B 45/20* (2020.01); *G05B 15/02* (2013.01); *G05G 1/105* (2013.01); *H01H 19/14* (2013.01); *H01H 19/54* (2013.01); *H01H 23/14* (2013.01); *H02J 3/00* (2013.01); *H02J 7/0047* (2013.01); *H02J 7/0063* (2013.01); *H03K 17/962* (2013.01); *H05B 45/24* (2020.01); *H05B 47/175* (2020.01); *H05B 47/19* (2020.01);
(Continued)

(58) Field of Classification Search
CPC ................ H05B 37/0272; G05B 15/02; G05B 2219/2614; H01H 19/14; H01H 23/14; H02J 3/00
USPC ........................... 700/286–298; 315/246–287
See application file for complete search history.

(56) References Cited

U.S. PATENT DOCUMENTS 5,264,761 A 11/1993 Johnson
7,242,150 B2 7/2007 DeJonge et al.
(Continued)

FOREIGN PATENT DOCUMENTS

CN 2596671 Y 12/2003
CN 101347050 A 1/2009
(Continued)

*Primary Examiner* — Brandon S Cole
(74) *Attorney, Agent, or Firm* — Flaster Greenberg, P.C.

(57) ABSTRACT

A load control device may be configured to control multiple characteristics of one or more electrical loads such as the intensity and color of a lighting load. The load control device may switch from controlling one characteristic of the electrical loads to controlling another characteristic of the electrical loads based on the position and/or orientation of one or more components of the load control device. Such a position and/or orientation may be manipulated by moving the one or more components relative to a base portion of the load control device. The load control device may be a wall-mounted device or a battery-powered remote control device.

21 Claims, 9 Drawing Sheets

(51) Int. Cl.

| | | |
|---|---|---|
| *E06B 9/80* | (2006.01) | |
| *H03G 3/00* | (2006.01) | |
| *H05B 45/20* | (2020.01) | |
| *H05B 47/19* | (2020.01) | |
| *H05B 45/24* | (2020.01) | |
| *H05B 47/175* | (2020.01) | |
| *G05B 15/02* | (2006.01) | |
| *H01H 19/14* | (2006.01) | |
| *H01H 23/14* | (2006.01) | |
| *H02J 3/00* | (2006.01) | |
| *G05G 1/10* | (2006.01) | |
| *H01H 19/54* | (2006.01) | |
| *H03K 17/96* | (2006.01) | |
| *H02J 7/00* | (2006.01) | |
| *H01H 19/02* | (2006.01) | |
| *G05G 1/08* | (2006.01) | |

(52) U.S. Cl.
CPC ....... *G05B 2219/2614* (2013.01); *G05G 1/08* (2013.01); *H01H 19/025* (2013.01); *H01H 2300/03* (2013.01); *Y02B 90/20* (2013.01); *Y04S 20/14* (2013.01)

(56) References Cited

U.S. PATENT DOCUMENTS

| | | | |
|---|---|---|---|
| 7,546,473 B2 | 6/2009 | Newman | |
| 7,573,208 B2 | 8/2009 | Newman, Jr. | |
| 8,330,638 B2 | 12/2012 | Altonen et al. | |
| 8,664,881 B2 | 3/2014 | Newman, Jr. et al. | |
| 9,112,466 B1 | 8/2015 | Koh et al. | |
| 9,208,965 B2 | 12/2015 | Busby et al. | |
| 9,418,802 B2 | 8/2016 | Romano et al. | |
| 9,520,247 B1 | 12/2016 | Finnegan et al. | |
| 9,583,288 B2 | 2/2017 | Jones et al. | |
| 9,746,138 B1* | 8/2017 | Thomas | G06F 13/4282 |
| 9,799,469 B2 | 10/2017 | Bailey et al. | |
| 9,959,997 B2 | 5/2018 | Bailey et al. | |
| 10,134,268 B2 | 11/2018 | Dimberg et al. | |
| 2003/0230982 A1* | 12/2003 | Pagano | H05B 39/08 |
| | | | 315/56 |
| 2008/0111491 A1 | 5/2008 | Spira | |
| 2008/0315798 A1* | 12/2008 | Diederiks | H05B 33/0863 |
| | | | 315/312 |
| 2009/0206769 A1 | 8/2009 | Biery et al. | |
| 2009/0256483 A1* | 10/2009 | Gehman | H05B 37/0272 |
| | | | 315/129 |
| 2010/0013649 A1 | 1/2010 | Spira | |
| 2010/0084996 A1* | 4/2010 | Van De Sluis | H05B 33/0863 |
| | | | 315/312 |
| 2010/0244706 A1 | 9/2010 | Steiner et al. | |
| 2010/0244709 A1 | 9/2010 | Steiner et al. | |
| 2012/0068611 A1 | 3/2012 | Steiner et al. | |
| 2012/0292174 A1 | 11/2012 | Mah et al. | |
| 2013/0099011 A1* | 4/2013 | Matsuoka | G05D 23/1904 |
| | | | 236/1 C |
| 2013/0067550 A1 | 5/2013 | Bruwer | |
| 2013/0338839 A1* | 12/2013 | Rogers | G05D 23/1904 |
| | | | 700/278 |
| 2014/0266669 A1* | 9/2014 | Fadell | G05B 19/042 |
| | | | 340/501 |
| 2015/0077021 A1 | 3/2015 | Smith et al. | |
| 2015/0294816 A1* | 10/2015 | Jones | H01H 23/148 |
| | | | 200/293 |
| 2015/0371534 A1 | 12/2015 | Dimberg et al. | |
| 2016/0073479 A1* | 3/2016 | Erchak | F21S 9/022 |
| | | | 315/51 |
| 2017/0105176 A1 | 4/2017 | Finnegan et al. | |
| 2017/0226799 A1* | 8/2017 | Hebeisen | E06B 9/80 |
| 2018/0190451 A1 | 7/2018 | Scruggs | |

FOREIGN PATENT DOCUMENTS

| | | |
|---|---|---|
| CN | 203491998 U | 3/2014 |
| WO | WO 2007/072316 A2 | 6/2007 |
| WO | 2014066269 A1 | 5/2014 |
| WO | 2016037213 A1 | 3/2016 |
| WO | 2017165858 A2 | 9/2017 |

* cited by examiner

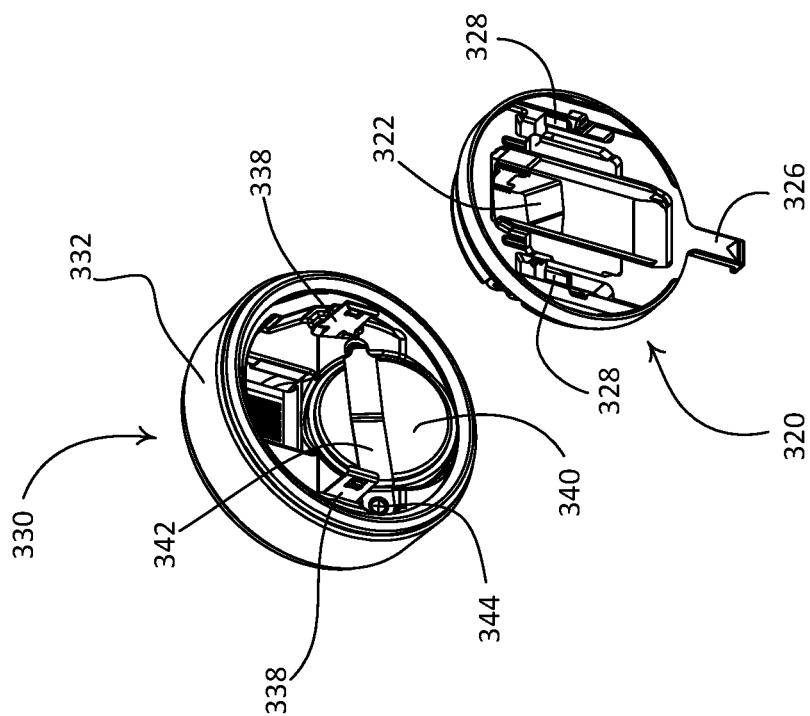
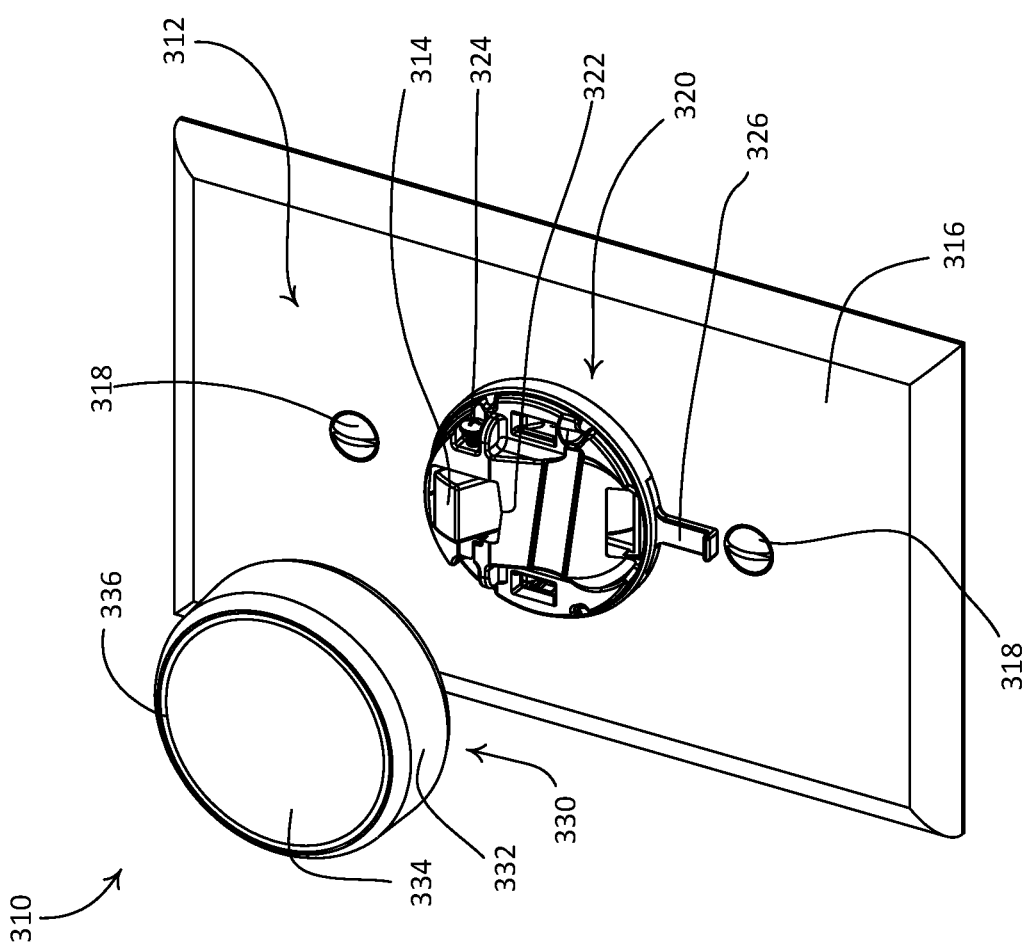
FIG. 4B
FIG. 4A

CONTROL DEVICE FOR CONTROLLING MULTIPLE OPERATING CHARACTERISTICS OF AN ELECTRICAL LOAD

CROSS-REFERENCE TO RELATED APPLICATIONS

This application claims the benefit of Provisional U.S. Patent Application No. 62/345,449, filed Jun. 3, 2016, and Provisional U.S. Patent Application No. 62/356,288, filed Jun. 29, 2016, the disclosures of which are incorporated herein by reference in their entireties.

BACKGROUND

The intensity and/or color of a lighting fixture may be manipulated for a variety of purposes such as presentation, comfort, and well-being. Typical color control techniques may include dim to warm, correlated color temperature (CCT), and full color tuning. Dim to warm is a technique for adjusting the color temperature of a light source in proportion to the intensity so as to mimic the color shift of incandescent lamps with respect to intensity (e.g., warmer color temperature at lower light levels, and cooler color temperature at higher light levels). CCT-based color tuning is a technique for controlling the color temperature and intensity of a light source independently within specified parameters. Full color tuning is a technique for changing the emitted color spectrum of a light source by mixing several base colors (e.g., red, green, blue) in different proportions.

Different types of intensity control/color tuning techniques may require different types of user interfaces. Dim to warm color control, for example, generally requires one control input. The input may be translated (e.g., by an LED driver) into an appropriate intensity and/or color control signal for driving the lighting fixture. CCT-based color tuning and/or full color control may require one control input for color temperature and a separate control input for light intensity. A user interface may also need to be capable of activating and/or deactivating preconfigured environmental settings (e.g., a lighting scene created by tuning one or more lighting fixtures to particular color and/or intensity values). Further, a user may desire to not only apply the aforementioned types of control, but also receive feedback about the type, amount and/or result of the control being applied.

A traditional control device is usually designed to control one specific aspect of an electrical load. For example, a dimmer switch may be only capable of controlling the intensity of a lighting load. To control the color of the lighting load, a separate control device is often required. Using multiple traditional control devices to control an electrical load not only increases the cost and work required to set up the concerned load control system, but also negatively affects the usability and aesthetic appeal of the system. The traditional control devices also have very simplistic user interfaces that lack a feedback mechanism for keeping a user informed about the type and/or amount of control being applied.

SUMMARY

As described herein, a control device may be configured for use in a load control system to control respective amount of power delivered to one or more electrical loads. The control device may be external to the one or more electrical loads, and may include a base portion, a rotating portion rotatable with respect to the base portion, an actuation portion defining a front surface, and a control circuit. The base portion may be configured to be mounted to an electrical wallbox (e.g., when the control device is a dimmer switch) or over an existing mechanical switch (e.g., when the control device is a retrofit remote control device). When configured as a dimmer device, the control device may further include a load control circuit adapted to be electrically coupled in series between an AC power source and the one or more electrical loads for controlling power delivered to the one or more electrical loads. When configured as a retrofit remote control device, the control device may be mounted over a toggle actuator of a mechanical switch that controls whether power is delivered to the one or more electrical loads.

The actuation portion of the control device may be moveable along an axis perpendicular to the base portion of the control device when the actuation portion is pushed in toward the base portion or pulled away from the base portion. The control circuit may be configured to generate first control data for changing a first characteristic (e.g., an intensity) of the one or more electrical loads in response to rotations of the rotating portion when the front surface of the actuation portion is located in a first plane along the axis, and generate second control data for changing a second characteristic (e.g., a color) of the one or more electrical loads in response to rotations of the rotating portion when the front surface of the actuation portion is located in a second plane parallel to the first plane. The control device may comprise a communication circuit configured to transmit, e.g., to the one or more electrical loads, a first control signal associated with the first control data and a second control signal associated with the second control data.

The control device may further include one or more visual indicators configured to be illuminated by one or more light sources. The one or more visual indicators may comprise a light bar. When illuminated, the light bar may provide feedback about the first and/or second characteristics of the one or more electrical loads.

BRIEF DESCRIPTION OF THE DRAWINGS

FIG. 4A is a perspective view of an example remote control device that may be deployed as a remote control device of the load control system illustrated in FIG. 1 with a control unit detached from a base portion.

FIG. 4B are rear views of the control unit and the base portion of the remote control device depicted in FIG. 4A.

DETAILED DESCRIPTION

Figure 1:
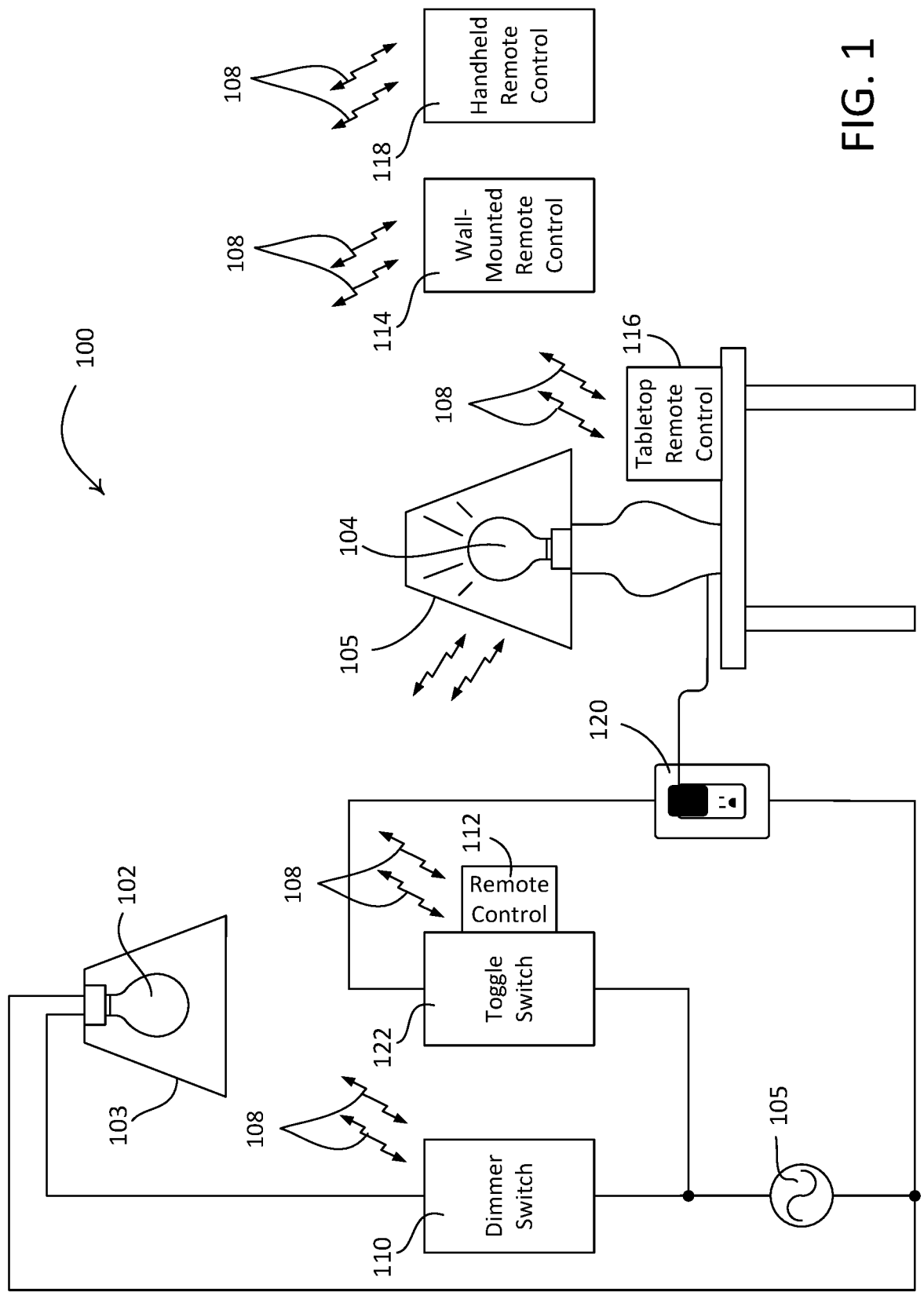
FIG. 1 depicts an example load control system that includes one or more example control devices.

FIG. 1 is a simplified diagram of an example load control system. As shown, the load control system is configured as a lighting control system 100 for control of one or more lighting loads, such as a lighting load 102 that is installed in a ceiling-mounted downlight fixture 103 and a controllable lighting load 104 that is installed in a table lamp 105. The lighting loads 102, 104 shown in FIG. 1 may include light sources of different types (e.g., incandescent lamps, fluorescent lamps, and/or LED light sources). The lighting loads may have advanced features. For example, the lighting loads may be controlled to emit light of varying intensities and/or colors in response to a user command. The amount of power delivered to the lighting loads may be adjusted to an absolute level or by a relative amount. The lighting control system 100 may be configured to control one or more of the lighting loads (e.g., and/or other electrical loads) according to one or more configurable presets or scenes. These presets or scenes may correspond to, for example, predefined light intensities and/or colors, predefined entertainment settings such as music selection and/or volume settings, predefined window treatment settings such as positions of shades, predefined environmental settings such as HVAC settings, or any combination thereof. The presets or scenes may correspond to one or more specific electrical loads (e.g., bedside lamps, ceiling lights, etc.) and/or one or more specific locations (e.g., a room, an entire house, etc.).

The lighting load 102 may be an example of a lighting load that is wired into a power control and/or delivery path of the lighting control system 100. As such, the lighting load 102 may be controllable by a wall-mounted control device such as a dimmer switch. The lighting load 104 may be an example of a lighting load that is equipped with integral load control circuitry and/or wireless communication capabilities such that the lighting load may be controlled via a wireless control mechanism (e.g., by a remote control device).

The lighting control system 100 may include one or more control devices for controlling the lighting loads 102, 104 (e.g., controlling an amount of power delivered to the lighting loads). The lighting loads 102, 104 may be controlled substantially in unison, or be controlled individually. For example, the lighting loads may be zoned so that the lighting load 102 may be controlled by a first control device, while the lighting load 104 may be controlled by a second control device. The control devices may be configured to turn the lighting loads 102, 104 on and off. The control devices may be configured to control the magnitude of a load current conducted through the lighting loads (e.g., so as to control an intensity of the lighting loads 102, 104 between a low-end intensity $L_{LE}$ and a high-end intensity $L_{HE}$). The control devices may be configured to control an amount of power delivered to the lighting loads to an absolute level (e.g., to a maximum allowable amount), or by a relative amount (e.g., an increase of 10% from a current level). The control devices may be configured to control a color of the lighting load 102, 104 (e.g., by controlling a color temperature of the lighting loads or by applying full color control over the lighting loads).

The control devices may be configured to activate a preset associated with the lighting load 102, 104 (e.g., a preset may be associated with one or more predetermined settings of the lighting loads such as an intensity level of the lighting loads and/or a color of the lighting loads). The presets may be configured via the control device and/or via an external device (e.g., a mobile device) by way of a wireless communication circuit of the control device. The control devices may be configured to activate control of a zone. A zone may correspond to one or more electrical loads that are configured to be controlled by the control devices. A zone may be associated with a specific location (e.g., a living room) or multiple locations (e.g., an entire house with multiple rooms and hallways). The control devices may be configured to switch between different operational modes. An operational mode may be associated with controlling different types of electrical loads or different operational aspects of one or more electrical loads. Examples of operational modes may include a lighting control mode for controlling one or more lighting loads (e.g., which in turn may include a color control mode and an intensity control mode), an entertainment system control mode (e.g., for controlling music selection and/or the volume of an audio system), an HVAC system control mode, a winter treatment device control mode (e.g., for controlling one or more shades), and/or the like.

The control device described herein may be, for example, a dimmer switch 110, a retrofit remote control device 112, a wall-mounted control device 114, a tabletop remote control device 116, and/or a handheld remote control device 118, as shown in FIG. 1. The dimmer switch 110 may include a base portion (e.g., such as one or more of a yoke, a bezel, and an enclosure that may house electrical circuitry and or mechanical complements of the dimmer switch 110) that is configured to be mounted to a standard electrical wallbox. Once mounted, the dimmer switch 110 may be coupled in series electrical connection between an alternating-current (AC) power source 105 and a lighting load that is wired into the control path of the dimmer switch 110 (e.g., such as the lighting load 102). The dimmer switch 110 may receive an AC mains line voltage $V_{AC}$ from the AC power source 105, and may generate a control signal for controlling the lighting load 102. The control signal may be generated via various phase-control techniques (e.g., a forward phase-control dimming technique or a reverse phase-control dimming technique). The dimmer switch 110 may be configured to receive wireless signals (e.g., from a remote control device) representative of commands to control the lighting load 102, and generate respective control signals for executing the commands. Examples of wall-mounted dimmer switches are described in greater detail with reference to FIG. 13, and in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR-CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The retrofit remote control device 112 may be configured to be mounted to a mechanical switch (e.g., a toggle switch 122, a paddle switch, a pushbutton switch, and/or other suitable switch) that may be pre-existing in the lighting control system 100. Such a retrofit solution may provide energy savings and/or advanced control features, for example without requiring significant electrical re-wiring and/or without requiring the replacement of existing mechanical switches. As an example, a consumer may replace an existing lamp with the controllable lighting load 104, switch a toggle switch 122 that is coupled to the lighting load 104 to the on position, install (e.g., mount) the remote control device 112 onto the toggle switch 122, and associate the remote control device 112 with the lighting source 104. The retrofit remoted control 112 may then be used to perform advanced functions that the toggle switch 122 may be incapable of performing (e.g., such as dimming the intensity level of the light output, changing the color of the light output, providing feedback to a user, etc.). As shown, the toggle switch 122 is coupled (e.g., via a series electrical connection) between the AC power source 105 and an electrical receptacle 120 into which the lighting load 104 may be plugged (e.g., as shown in FIG. 1). Alternative, the toggle switch 122 may be coupled between the AC power source 105 and one or more of the lighting loads 102, 104, without the electrical receptacle 120.

The wall-mounted remote control device 114 may be configured to be mounted to a standard electrical wallbox and be electrically connected to the AC power source 105 for receiving power. The wall-mounted remote control device 114 may be configured to receive a user input and may generate and transmit a control signal (e.g., control data such as a digital message) for controlling the lighting loads 102, 104 in response to the user input. The tabletop remote control device 116 may be configured to be placed on a surface (e.g., an end table or night stand), and may be powered by a direct-current (DC) power source (e.g., a battery or an external DC power supply plugged into an electrical outlet). The tabletop remote control device 116 may be configured to receive a user input, and may generate and transmit a signal (e.g., a digital message) for controlling the lighting loads 102, 104 in response to the user input. The handheld remote control device 118 may be sized to fit into a user's hand, and may be powered by a direct-current (DC) power source (e.g., a battery or an external DC power supply plugged into an electrical outlet). The handheld remote control device 118 may be configured to receive a user input, and may generate and transmit a signal (e.g., a digital message) for controlling the lighting loads 102, 104 in response to the user input. Examples of battery-powered remote controls are described in greater detail in commonly assigned U.S. Pat. No. 8,330,638, issued Dec. 11, 2012, entitled WIRELESS BATTERY POWERED REMOTE CONTROL HAVING MULTIPLE MOUNTING MEANS, and U.S. Pat. No. 7,573,208, issued Aug. 11, 2009, entitled METHOD OF PROGRAMMING A LIGHTING PRESET FROM A RADIO-FREQUENCY REMOTE CONTROL, the entire disclosures of which are hereby incorporated by reference.

The control devices described herein (e.g., the dimmer switch 110 and/or remote control devices 112-118) may each include a user input unit. The user input unit may be configured to receive (e.g., detect) user inputs for controlling one or more of the lighting loads 102, 104, and/or the control device itself. A plurality of mechanisms for receiving the user inputs may be implemented on the user input unit, including, for example, a rotating mechanism (e.g., such as a rotary knob or a dial), a button or switch or an imitation thereof, and a touch sensitive device (e.g., such as a capacitive touch surface) configured to detect both point actuations and gestures.

The control devices described herein (e.g., the dimmer switch 110 and/or remote control devices 112-118) may each include one or more visual indicators (e.g., a light bar) configured to be illuminated by one or more light sources (e.g., one or more LEDs). The one or more visual indicators may be provided on the user input unit or may be separate from the user input unit. The one or more visual indicators may be operable to provide feedback to a user of the control device. Such feedback may indicate, for example, a status of a lighting load (e.g., the lighting loads 102, 104) controlled by the control device. The status may reflect, for example, whether the lighting load is on or off, a present intensity of the lighting load, a color of the lighting load, and so on. The feedback may indicate a status of the control device itself, for example, such as a present operational mode of the control device (e.g., an intensity control mode or a color control mode), a power status of the control device (e.g., remaining battery power), and so on. As an example, the control device may provide feedback via the visual indicators while the control device is being actuated and/or after the control device is actuated. The feedback may indicate to the user that the control device is transmitting control signals (e.g., RF signals) in response to the actuation. The control device may be configured to keep the visual indicators illuminated while the condition triggering the feedback continues to exist. The control device may be configured to illuminate the visual indicators for a few seconds (e.g., 1-2 seconds) and then turn off the visual indicators (e.g., to conserve battery life).

The control devices described herein (e.g., the dimmer switch 110 and/or remote control devices 112-118) may each include a control circuit. The control circuit may be configured to be responsive to a user input received via the user input unit. The control circuit may be configured to generate control data (e.g., a control signal) for controlling the lighting loads 102, 104 in response to the user input. The control data may include commands and/or other information (e.g., device identification information) for controlling the lighting loads 102, 104. The control data may be included in a control signal transmitted to the lighting loads 102, 104 via a wireless communication circuit. The control circuit may be configured to illuminate the one or more visual indicators to provide feedback of the control being applied and/or its outcome.

The control devices described herein (e.g., the dimmer switch 110 and/or remote control devices 112-118) may each include a wireless communication circuit for transmitting and/or receiving radio frequency (RF) signals 108. The wireless communication circuit may be used to transmit a control signal that includes the control data (e.g., a digital message) generated by the control device to the lighting loads 102, 104 or to a central controller of the lighting control system 100, for example. The control data may be generated in response to a user input to adjust one or more operational aspects of the lighting loads 102, 104. The control data may include a command and/or identification information (e.g., such as a unique identifier) associated with the control device and/or one or more of the lighting loads 102, 104 (e.g., and/or other electrical loads of the load control system 100).

The control devices (e.g., the remote control devices 112-118) may be associated with one or more lighting loads and/or other control devices (e.g., the dimmer switch 110) for controlling the lighting loads (e.g., through a configuration procedure). Upon such association, the lighting loads 102, 104 may be responsive to control signals transmitted by the control devices. To illustrate, the association may be accomplished by actuating an actuator on the concerned lighting loads and/or control devices, and then actuating (e.g., pressing and holding) an actuator on the control device for a predetermined amount of time (e.g., approximately 10 seconds). Examples of a configuration procedure for associating a control device with an electrical load is described in greater detail in commonly-assigned U.S. Patent Publication No. 2008/0111491, published May 15, 2008, entitled RADIO-FREQUENCY LIGHTING CONTROL SYSTEM, the entire disclosure of which is hereby incorporated by reference. The wireless communication circuit may also be controlled to transmit/receive feedback information regarding the control device and/or the lighting loads 102, 104 via RF signals.

The control device described herein (e.g., the dimmer switch 110 and/or remote control devices 112-118) may include a memory (not shown). The memory may be used, for example, to store operational settings associated with the control device and/or the lighting loads 102, 104 (e.g., such as lighting presets and their associated light intensities and/or colors). The memory may be implemented as an external integrated circuit (IC) or as an internal circuit (e.g., as part of a control circuit).

Further, it should be appreciated that, although a lighting control system with two lighting loads is provided as an example above, a load control system as described herein may include more or fewer lighting loads, other types of lighting loads, and/or other types of electrical loads that may be configured to be controlled by the one or more control devices. For example, the load control system may include one or more of: a dimming ballast for driving a gas-discharge lamp; an LED driver for driving an LED light source; a dimming circuit for controlling the intensity of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a set-point temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; an audio system or amplifier; an elevator; a power supply; a generator; an electric charger, such as an electric vehicle charger; an alternative energy controller; and/or the like.

Figure 2:
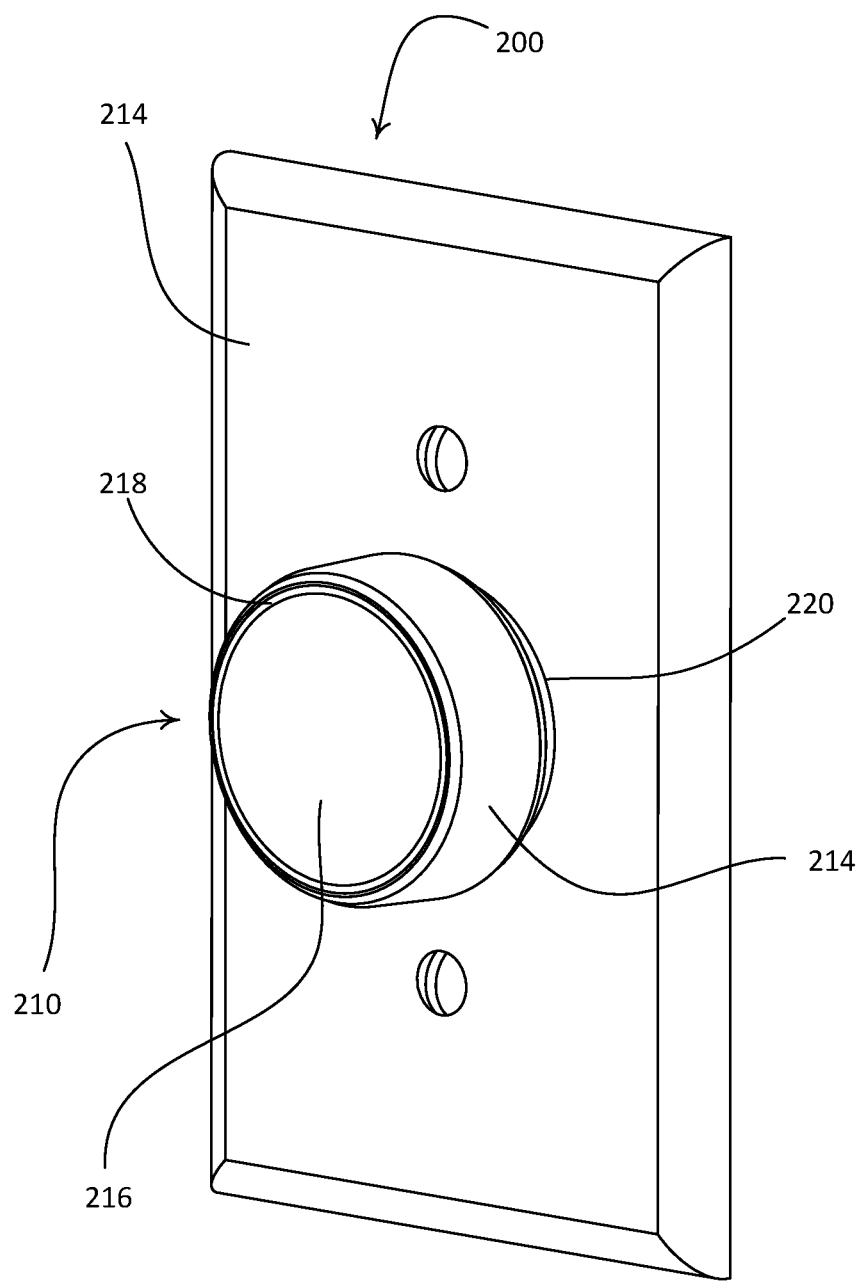
FIG. 2 is a perspective view of an example control device that may be deployed as a dimmer switch and/or a remote control device of the load control system illustrated in FIG. 1.

FIG. 2 depicts an example control device 200 that may be deployed as the dimmer switch 110 and/or the retrofit remote control device 112 in the lighting control system 100. The lighting control system 100 may include one or more lighting loads, such as the lighting loads 102, 104. The control device 200 may comprise a user interface 210 (e.g., a user input device) and a faceplate 212. The user interface 202 may include a rotating portion 214 that is rotatable with respect to the faceplate 212 for controlling multiple characteristics (e.g., two different operating characteristics) of the lighting loads controlled by the control device (e.g., adjusting the intensities and/or the colors of the lighting loads). The user interface 210 may also include an actuation portion 216 that may be pressed in towards the faceplate 212 for turning the lighting loads on and off (e.g., toggling the lighting loads). More generally, the control device 200 may be responsive to a dynamic motion of the actuation portion 216 (e.g., an actuation that causes movement of the surface of the actuation portion). The user interface 210 may also include one or more visual indicators (e.g., a light bar 218) configured to be illuminated by one or more light sources (e.g., one or more LEDs) to visibly display information. The light bar 218 may be attached to a periphery of the actuation portion 216 and may move with the actuation portion 216 (e.g., when the actuation portion is actuated). The control device 200 may comprise a base portion 220 for rotatably supporting the rotation portion 214.

The positions and/or orientations of one or more components of the control device 200 may be changed relative to the faceplate 212 and/or the base portion 220 in order to put the control device 200 into a certain control mode as will be described in greater detail below. For example, the control device 200 (e.g., one or more components of the control device 200) may be positioned in different planes along an axis substantially perpendicular to a plane of the front surface of the faceplate 206 and/or a plane of the base portion 220. In an example, the rotating portion 214 may be pushed in towards and/or pulled away from the faceplate 212 and/or the base portion 220 to switch the control device 200 between an intensity control mode and a color control mode (e.g., a color temperature control mode).

The rotating portion 214 may be connected to the actuation portion 216 and may move with the actuation portion 216 (e.g., move towards the faceplate 212 along an axis perpendicular to the faceplate) to actuate an internal switch (not shown) when the actuation portion 216 is actuated. The actuation portion 216 may have a front surface that may define a front area of the rotating portion 214. In an alternative example implementation, the actuation portion 216 may be separate from the rotating portion 214 and may be received in a central circular opening defined by the rotating portion 214 to allow the actuation portion 216 to move in towards the faceplate 212 along the axis perpendicular to the faceplate to actuate the internal switch when the actuation portion 216 is actuated. The actuation portion 216 may return (e.g., move away from the faceplate 212 along the axis perpendicular to the faceplate) to an idle position (e.g., as shown in FIG. 2) after being actuated.

When the actuation portion 216 is in the idle position, the front surface of the actuation portion 216 (e.g., the front area of the rotation portion 214) may be located in a first plane that may be parallel to a front surface of the faceplate 212 (e.g., along an axis perpendicular to the front surface of the faceplate 212 or to the base portion 220). When the front surface of the actuation portion 216 is in the first plane, the actuation portion 216 may be configured to not actuate the internal switch. The rotating portion 214 may be rotated to adjust the amount of power delivered to the lighting loads to adjust the intensities of the lighting loads when the front surface of the actuation portion 216 is in the first plane. For example, when the rotating portion 214 is rotated to adjust the intensity of the lighting loads while the front surface of the actuation portion 216 is in the first plane, the light bar 218 may be illuminated (e.g., illuminated in a single color, such as white) to display feedback information regarding the present intensity of one or more of the lighting loads.

Figure 3B:
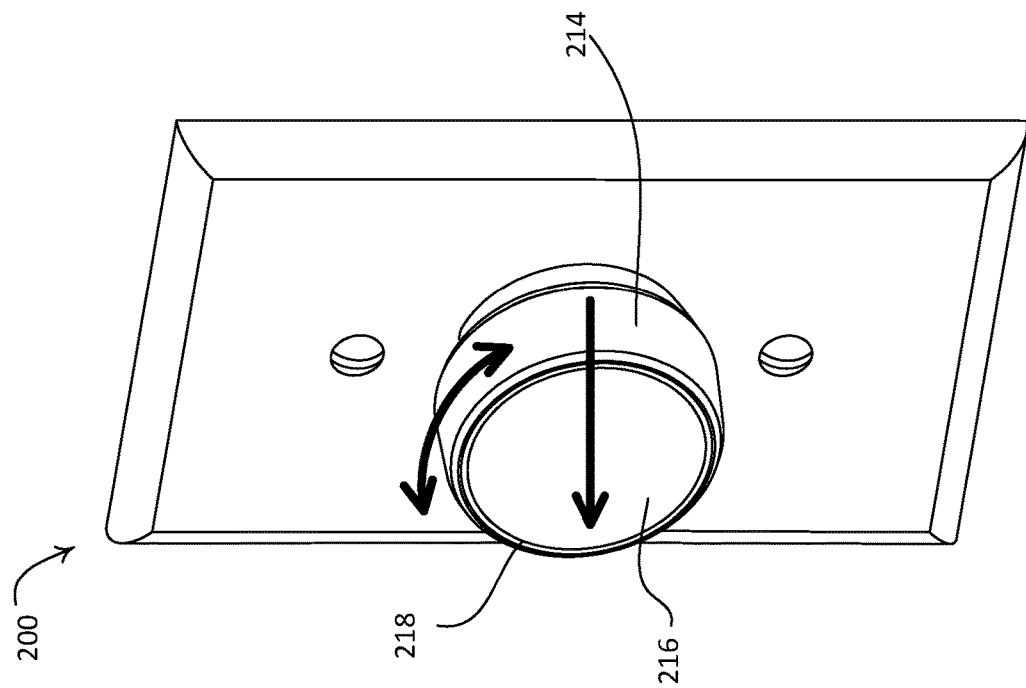
FIGS. 3A and 3B show example perspective views of the remote control device of FIG. 2 illustrating how the positions and/or orientations of one or more components of a control unit of the remote control device may be changed relative to a base portion in order to put the remote control device into a certain control mode.
Figure 3A:
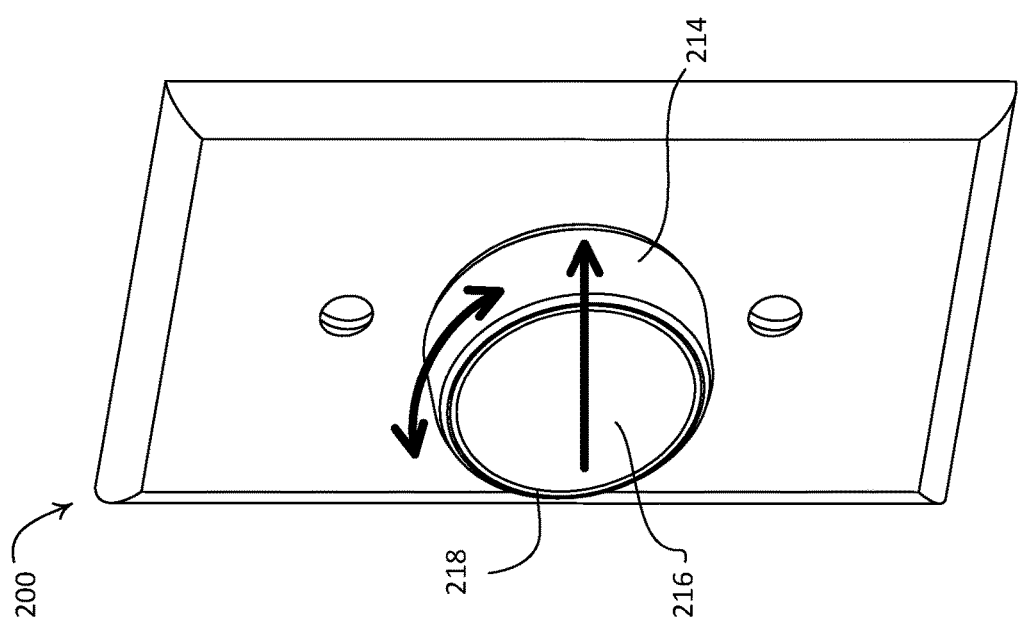

As shown in FIG. 3A, the rotating portion 214 and/or the actuation portion 216 may be pushed in towards the faceplate 212 to cause the front surface of the actuation portion 216 to be in a second plane that is parallel to the front surface of the faceplate and/or to the base portion 220. The second plane may be closer to the faceplate than the first plane. When the front surface of the actuation portion 216 is in the second plane, the actuation portion 216 may be actuating (e.g., constantly actuating) the internal switch. The rotating portion 214 may be rotated to adjust a color (e.g., a color temperature) of the lighting load when the front surface of the actuation portion 216 is in the second plane. The front surface of the actuation portion 216 may be maintained in the second plane without being held in the second plane (e.g., without an external force that may be applied through user interaction). Alternatively or additionally, the user may press and hold the rotating portion 214 and/or the actuation portion 216 of the control device 200 in (e.g., towards the faceplate 212) in order to place the control device 200 in the color control mode. The rotating portion 214 and/or the actuation portion 216 may be held by an external force (e.g., which may be applied by a user) while the front surface of the actuation portion 216 is in the second plane. The rotating portion 214 and/or the actuation portion 216 may be biased (e.g., spring biased) back to return the front surface of the actuation portion 216 to the first plane when the external force is no longer applied (e.g., when the rotating portion 214 is released).

In addition, as shown in FIG. 3B, the rotating portion 214 and/or the actuation portion 216 may be pulled out away from the faceplate 212 (e.g., along an axis perpendicular to the faceplate 212 and/or the base portion 216) to cause the front surface of the actuation portion 216 to be in a third plane that is parallel to the front surface of the faceplate and farther away from the faceplate than the first plane. The control device 200 may be configured to detect that the front surface of the actuation portion 216 has been moved from the first plane to the third plane. For example, the control device 200 may include a switch that is configured to be open (e.g., non-conductive) when the front surface of the actuation portion 216 is in the first plane and closed (e.g., conductive) when the front surface of the actuation portion 216 is in the third plane. In response to a movement of the actuation portion 216, the control circuit may receive an indication of the state of the switch (e.g., open or close) and determine the position of the actuation portion 216 accordingly. Alternatively or additionally, the control device 200 may be configured to detect the position of the actuation portion 216 via a sensor (e.g., a light emitting diode (LED) sensor), a photosensitive device, an optocoupler that comprises an infra-red (IR) light emitting diode (LED) and a photodiode, an inductive sensor, a hall-effect sensor circuit, a manually operated switch, and/or the like.

When the front surface of the actuation portion 216 is in the third plane, the rotating portion 214 may be rotated to adjust the color (e.g., the color temperature) of the lighting load.

The rotating portion 214 may be maintained in the third plane without being held in the third plane (e.g., without an external force applied through user interaction). Alternatively or additionally, the user may pull and hold rotating portion 214 and/or the actuation portion 216 of the control device 200 (e.g., away from the faceplate 212) in order to place the control device 200 in the color control mode. The rotating portion 214 and/or the actuation portion 216 may be held by an external force (e.g., which may be applied by a user) while the front surface of the actuation portion 216 is in the third plane. The rotating portion 214 and/or the actuation portion 216 may be biased (e.g., spring biased) back to return the front surface of the actuation portion 216 to the first plane when the external force is no longer applied (e.g., when the rotating portion 214 is released).

Slow rotations of the rotating portion 214 while the front surface of the actuation portion 216 is in the second plane or the third plane may provide fine tune adjustments of the color of the lighting loads. Fast rotations of the rotating portion 214 while the front surface of the actuation portion 216 is in the second plane or the third plane may provide gross adjustments of the color of the lighting loads.

When the rotation portion 214 is rotated to adjust the color of the lighting loads while the front surface of the actuation portion 216 is in the second plane or the third plane, the light bar 218 may be illuminated, for example, with one or more colors to provide feedback of the present color of one or more of the lighting loads. For example, the entire light bar 218 may be illuminated a single color to provide feedback of the present color of one or more of the lighting loads. Additionally or alternatively, the front surface of the actuation portion 216 may be illuminated a single color (e.g., from behind by LEDs inside of the control device 200) to provide feedback of the present color of one or more of the lighting loads.

Although the control device 200 is described herein as having two operational modes corresponding to different positions of the front surface of the actuation portion 216, it will be appreciated that the control device 200 is not limited to having only two operational modes. The actuation portion 216 may be configured to be moveable among multiple positions (e.g., more than two positions) along the axis that is perpendicular to the faceplate 212. Each of those positions may correspond to a different mode of the control device 200 (e.g., intensity, color temperature, full color, etc.). The actuation portion 216 may also be configured to have different orientations (e.g., tilted at different angles with respect to a plane of the faceplate 212) that correspond to various operational modes of the control device 200.

FIGS. 4A and 4B are front and rear exploded perspective views of another example remote control device 310 that may be deployed as the retrofit remote control device 112 in the lighting control system 100 shown in FIG. 1 and/or the control device 200 shown in FIG. 2. The remote control device 310 may be configured to be mounted over an actuator of a standard light switch 312 (e.g., a toggle actuator of a single pole single throw (SPST) maintained mechanical switch). The remote control device 310 may be installed over of an existing faceplate 316 that is mounted to the light switch 312 (e.g., via faceplate screws 318). The remote control device 310 may include a base portion 320 and a control unit 330 that may be operably coupled to the base portion 320. The control unit 330 may be supported by the base portion 320 and may include a rotating portion 332 (e.g., an annular rotating portion) that is rotatable with respect to the base portion 320.

As shown in FIG. 4A, the control unit 330 may be detached from the base portion 320. The base portion 320 may be attached (e.g., fixedly attached) to a toggle actuator 314 and may be configured to maintain the toggle actuator 314 in the on position. The toggle actuator 314 may be received through a toggle actuator opening 322 in the base portion 320. A screw 324 may be tightened to attach (e.g., fixedly attached) the base portion 320 to the toggle actuator 314. In this regard, the base portion 320 may be configured to prevent a user from inadvertently switching the toggle actuator 314 to the off position when the remote control device 310 is attached to the light switch 312.

The control unit 330 may be released from the base portion 320. For example, a control unit release tab 326 may be provided on the base portion 320. By actuating the control unit release tab 326 (e.g., pushing up towards the base portion or pulling down away from the base portion), a user may remove the control unit 330 from the base portion 320.

The control unit 330 may comprise one or more clips 338 that may be retained by respective locking members 328 connected to the control unit release tab 326 when the base portion 320 is in a locked position. The one or more clips 338 may be released from the respective locking members 328 of the base portion 320 when the control unit release tab 326 is actuated (e.g., pushed up towards the base portion or pulled down away from the base portion) to put the base portion 320 in an unlocked position. In an example, the locking members 328 may be spring biased into the locked position and may automatically return to the locked position after the control unit release tab 326 is actuated and released. In an example, the locking members 328 may not be spring biased, in which case the control unit release tab 326 may be actuated to return the base portion 320 to the locked position.

The control unit 330 may be installed on the base portion 320 without adjusting the base portion 320 to the unlocked position. For example, the one or more clips 338 of the control unit 330 may be configured to flex around the respective locking members 328 of the base portion and snap into place, such that the control unit 330 is fixedly attached to the base portion.

The control unit 330 may be released from the base portion 320 to access one or more batteries 340 (e.g., as shown in FIG. 4B) that provides power to at least the remote control device 310. The batteries 340 may be held in place in various ways. For example, the batteries 340 may be held by a battery retention strap 342, which may also operate as an electrical contact for the batteries. The battery retention strap 342 may be loosened by untightening a battery retention screw 344 to allow the batteries 340 to be removed and replaced. Although FIG. 4B depicts the batteries 340 as being located in the control unit 330, it should be appreciated that the batteries 340 may be placed elsewhere in the remote control device 310 (e.g., in the base portion 320) without affecting the functionality of the remote control device 310.

When the control unit 330 is coupled to the base portion 320, the rotating portion 332 may be rotatable in opposed directions about the base portion 320 (e.g., in the clockwise and/or counter-clockwise directions). The base portion 320 may be configured to be mounted over the toggle actuator 314 of the switch 312 such that the rotational movement of the rotating portion 332 may not change the operational state of the toggle actuator 314 (e.g., the toggle actuator 314 may remain in the on position to maintain functionality of the remote control device 310).

The control unit 330 may comprise an actuation portion 334. The actuation portion 334 may in turn comprise a part or an entirety of a front surface of the control unit 330. For example, the control unit 330 may have a circular surface within an opening defined by the rotating portion 332. The actuation portion 334 may comprise a part of the circular surface (e.g., a central area of the circular surface) or approximately the entire circular surface. The actuation portion 334 may be received in a central circular opening defined by the rotating portion 332. In an example, the actuation portion 334 may be configured to move towards the light switch 312 (e.g., through the central opening of the rotation portion 332) to actuate a mechanical switch (not shown) inside the control unit 330 as will be described in greater detail below. The actuation portion 334 may return to an idle position after being actuated. In addition, the rotating portion 332 may be connected to the actuation portion 334 and may move with the actuation portion to actuate the mechanical switch when the actuation portion 332 is actuated.

When the actuation portion 334 is in the idle position, a front surface of the actuation portion 334 may be located in a first plane that may be parallel to a front surface of the base portion 320. The rotating portion 332 and/or the actuation portion 334 may be pushed into towards the base portion 320 to cause the front surface of the actuation portion 334 to be in a second plane that is parallel to the front surface of the faceplate and closer to the faceplate than the first plane. In addition, the rotating portion 332 and/or the actuation portion 334 may be pulled out away from the base portion 320 to cause the front surface of the actuation portion 334 to be in a third plane that is parallel to the front surface of the faceplate and farther away from the faceplate than the first plane.

The remote control device 310 may be configured to transmit one or more wireless communication signals (e.g., the RF signals 108 of FIG. 1) to an electrical load (e.g., the lighting loads 102, 104 of the lighting control system 100 of FIG. 1). The remote control device 310 may include a wireless communication circuit (e.g., an RF transceiver or transmitter (not shown)) via which one or more wireless communication signals may be sent and/or received. The control unit 330 may be configured to transmit digital messages (e.g., including commands to control the controllable electrical load) via the wireless communication signals. For example, when the front surface of the actuation portion 334 is in the first plane, the control unit 330 may be configured to transmit a command, via the wireless communication circuit, to raise the intensity of a controllable lighting load in response to a clockwise rotation of the rotating portion 332 and to transmit a command to lower the intensity of the controllable light source in response to a counterclockwise rotation of the rotating portion 332. In addition, when the front surface of the actuation portion 334 is in either the second plane or the third plane, the control unit 330 may be configured to transmit a command, via the wireless communication circuit, to adjust the color (e.g., the color temperature) of the controllable light source in response to clockwise and counterclockwise rotations of the rotating portion 332.

The control unit 330 may be configured to transmit a command to toggle an electrical load (e.g., from off to on or vice versa) in response to an actuation of the actuation portion 334. In addition, the control unit 330 may be configured to transmit a command to turn an electrical load on in response to an actuation of the actuation portion 334 (e.g., if the control unit 330 possesses information indicating that the electrical load is presently off). The control unit 330 may be configured to transmit a command to turn an electrical load off in response to an actuation of the actuation portion 334 (e.g., if the control unit possesses information indicating that the electrical load is presently on).

The control unit 330 may be configured to transmit a command to turn an electrical load on to a maximum power level (e.g., to turn a light source on to full intensity) in response to a double tap of the actuation portion 334 (e.g., two actuations in quick succession). The control unit 330 may be configured to adjust the power level of an electrical load to a minimum level (e.g., to turn the intensity of a lighting load to a minimum intensity) in response to rotation of the rotating portion 332 and may only turn off the electrical load in response to an actuation of the actuation portion 334. The control unit 330 may also be configured in a spin-to-off mode, in which the control unit 330 may turn off an electrical load after the power level of the electrical load (e.g., intensity of the lighting load) is controlled to a minimum level in response to a rotation of the rotating portion 332 (e.g., without an actuation of the actuation portion).

The control unit 330 may comprise one or more visual indicators (e.g., a light bar 336) that may be illuminated by one or light sources (e.g., LEDs), for example, to provide feedback to a user of the remoted control device 310. The light bar 336 may be located in different areas of the remote control device 310 in different implementations. For example, the light bar 336 may be located between the rotating portion 332 and the actuation portion 334, and/or extend along the perimeter of the rotating portion 332 or the actuation portion 334. The light bar 336 may have different shapes. For example, the light bar 336 may form a full circle (e.g., a substantially full circle) as shown in FIG. 4A, a partial circle, a linear light bar, and/or the like. The light bar 336 may be attached to a periphery of the actuation portion 334 and move with the actuation portion 334 (e.g., when the actuation portion is actuated). The light bar 336 may have a certain width (e.g., a same width along the entire length of the light bar). The exact value of the width may vary, for example, depending on the size of the remote control device 310 and/or the intensity of the light source(s) that illuminates the light bar 336.

Figure 4C:
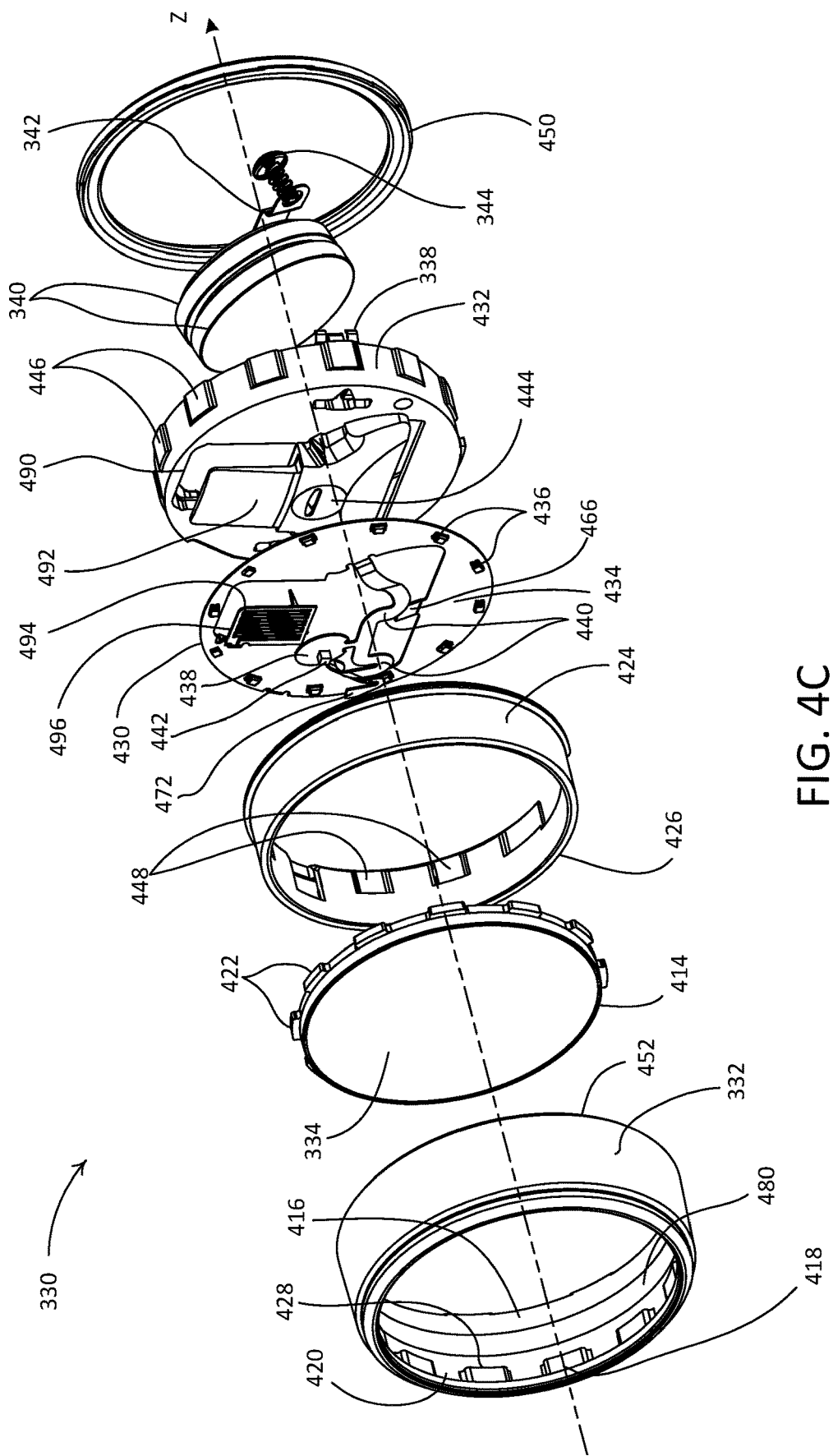
FIG. 4C is a front exploded view of the control unit for the remote control device depicted in FIG. 4A.
Figure 4D:
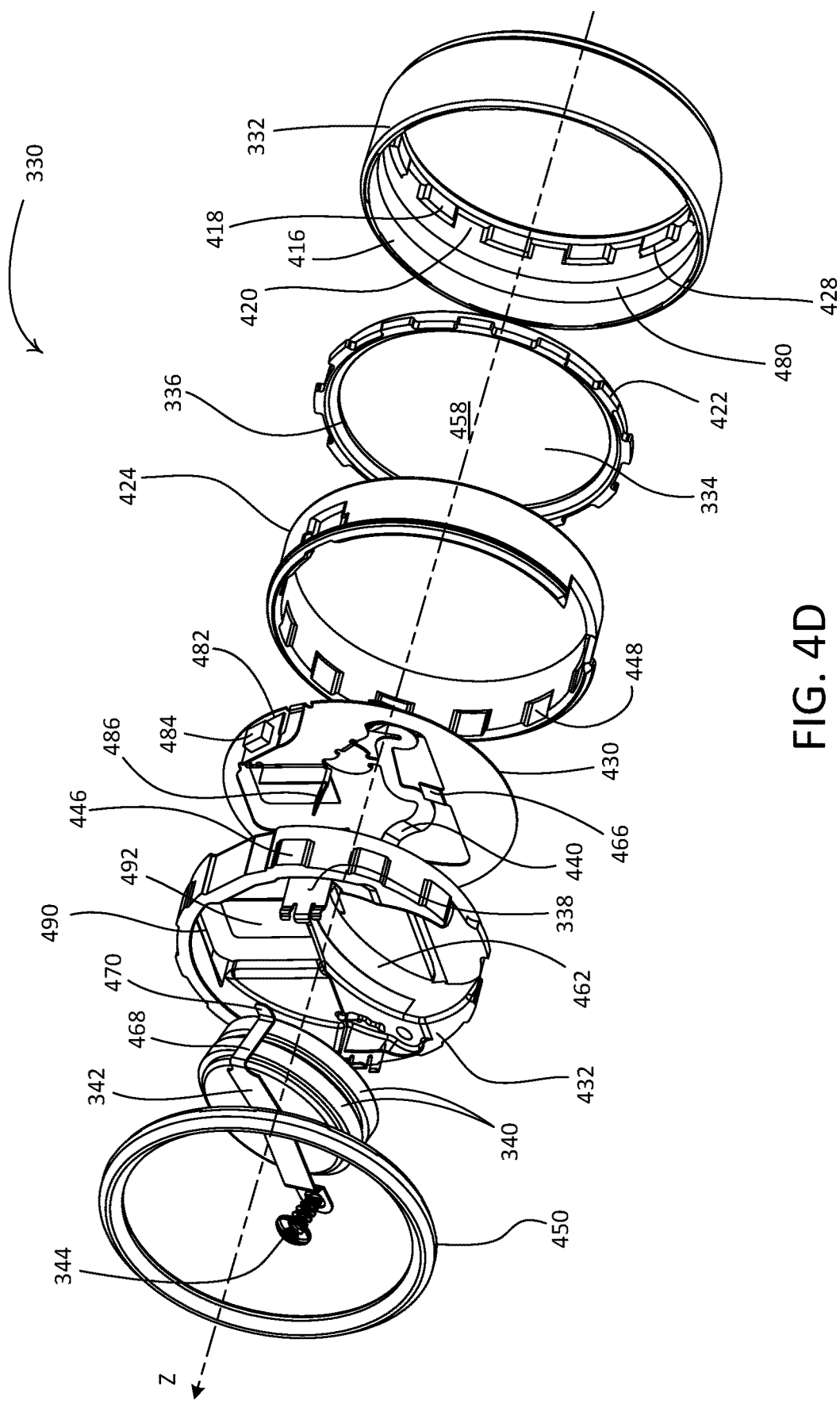
FIG. 4D shows a rear exploded view of the control unit for the example remote control device depicted in FIG. 4C.

FIG. 4C is a front exploded view and FIG. 4D is a rear exploded view of the control unit 330 of the remote control device 310. The actuation portion 334 may be received within an opening defined by the rotating portion 332. The light bar 336 may be attached to the actuation portion 334 around a periphery of the actuation portion. The rotating portion 332 may comprise an inner surface 416 having tabs 418 surrounding the circumference of the rotation portion. The tabs 418 may be separated by notches 420 that are configured to receive engagement members 422 of the actuation portion 334 to thus engage the actuation portion 334 with the rotating portion 332. The control unit 330 may also comprise a bushing 424 that is received within the rotating portion 332, such that an upper surface 426 of the busing may contact lower surfaces 428 of the tabs 418 inside of the rotating portion.

When the actuation portion 334 is received within the opening of the rotating portion 332, the light bar 336 may be provided between the actuation portion 334 and the rotating portion 332. When the rotating portion 334 is rotated, the actuation portion 334 and/or the light bar 336 may rotate with the rotating portion. The engagement members 422 of the actuation portion 334 may be able to move through the notches 420 in a z-direction (e.g., towards the base portion), such that the actuation portion 334 (along with the light bar 336) may be able to move in the z-direction.

The control unit 330 may further comprise a flexible printed circuit board (PCB) 430 that may be arranged over a carrier 432. The flexible PCB 430 may comprise a main portion 434 on which most of the control circuitry of the control unit 330 (e.g., including a control circuit) may be mounted. The control unit 330 may comprise a plurality of light-emitting diodes (LEDs) 436 arranged around the perimeter of the flexible PCB 430 to illuminating the light bar 336. The flexible PCB 430 may comprise a switch tab 438 that may be connected to the main portion 434 (e.g., via flexible arms 440). The switch tab 438 may have a mechanical tactile switch 442 mounted thereto. The switch tab 438 of the flexible PCB 430 may be configured to rest on a switch tab surface 444 on the carrier 432. The carrier 432 may comprise engagement members 446 configured to be received within notches 448 in the bushing 424. A ring 450 may snap to a lower surface 452 of the rotating portion to hold the control unit 330 together. The clips 338 may be attached to the carrier 432 to allow the control unit 330 to be connected to the base portion.

When the actuation portion 334 is pressed, the actuation portion 334 may move along the z-direction until an inner surface 458 of the actuation member actuates the mechanical tactile switch 442. The actuation portion 334 may be returned to the idle position by the mechanical tactile switch 442. In addition, the control unit 330 may comprise an additional return spring for returning the actuation portion 334 to the idle position. In some examples, actuations of the actuation portion 334 may not cause the actuation portion to move (e.g., the actuation portion 334 may substantially maintain its position along the z-direction). For example, the front surface of the actuation portion 334 may be a touch sensitive surface (e.g., a capacitive touch surface) configured to detect a user input via a point actuation and/or a gesture.

The batteries 340 may be adapted to be received within a battery recess 462 in the carrier 432 as shown in FIG. 4D. The batteries 340 may be held in place by the battery retention strap 342, which may also operate as a negative electrical contact for the batteries and tamper resistant fastener for the batteries. The flexible PCB may comprise a contact pad 466 that may operate as a positive electrical contact for the batteries 340. The battery retention strap 342 may comprise a leg 468 that ends in a foot 470 that may be electrically connected to a flexible pad 472 (e.g., as shown in FIG. 4C) on the flexible PCB 430. The battery retention strap 342 may be held in place by the battery retention screw 344 received in an opening 476 in the carrier 432. When the battery retention screw 344 is loosened and removed from the opening 476, the flexible pad 472 may be configured to move (e.g., bend or twist) to allow the battery retention strap 342 to move out of the way of the batteries 340 to allow the batteries to be removed and replaced.

The control unit 330 may further comprise a magnetic strip 480 located on the inner surface 416 of the rotating portion 332 and extending around the circumference of the rotating portion. The flexible PCB 430 may comprise a rotational sensor pad 482 on which a rotational sensor (e.g., a Hall effect sensor integrated circuit 484) may be mounted. The rotational sensor pad 482 may be arranged perpendicular to the main portion 434 of the flexible PCB 430 as shown in FIG. 4D. The magnetic strip 480 may comprise a plurality of alternating positive and negative sections, and the Hall effect sensor integrated circuit 484 may comprise two sensor circuits operable to detect the passing of the positive and negative sections of the magnetic strip as the rotating portion 332 is rotated. Accordingly, the control circuit of the control unit 330 may be configured to determine the rotational speed and direction of rotation of the rotation portion 332 in response to the Hall effect sensor integrated circuit 484. The flexible PCB 430 may also comprise a programming tab 486 to allow for programming of the control circuit of the control unit 330.

As shown in FIG. 4D, the carrier 432 may comprise an actuator opening 490 adapted to receive the toggle actuator of the light switch when the control unit 330 is mounted to the base portion. The carrier 432 may comprise a flat portion 492 that may prevent the toggle actuator of the light switch from extending into the inner structure of the control unit 330 (e.g., if the toggle actuator is particularly long). The flexible PCB 430 may also comprise an antenna 494 on an antenna tab 496 that may lay against the flat portion 492 in the actuator opening 490.

While the rotating portions 214, 332 and the actuations portions 216, 334 of the control device 200 and the remote control device 310 shown and described herein have a circular shape, the rotating portions and the actuation portions could have other shapes. For example, the rotating portions and the actuation portions may a rectangular shape, a square shape, a diamond shape, a triangular shape, an oval shape, a star shape, or any suitable shape. The front surface of the actuations portions 216, 334 and/or the side surfaces of the rotating portions 214, 332 may be planar or non-planar. In addition, the light bars 218, 336 may have alternative shapes, such as a rectangular shape, a square shape, a diamond shape, a triangular shape, an oval shape, a star shape, or any suitable shape. The light bars 218, 336 may be continuous loops, partial loops, broken loops, a single linear bar, a linear or circular array of visual indicators, and/or other suitable arrangement. The surfaces of the control device 200 and/or the remote control device 300 may be characterized by various colors, finishes, designs, patterns, etc.

Figure 5:
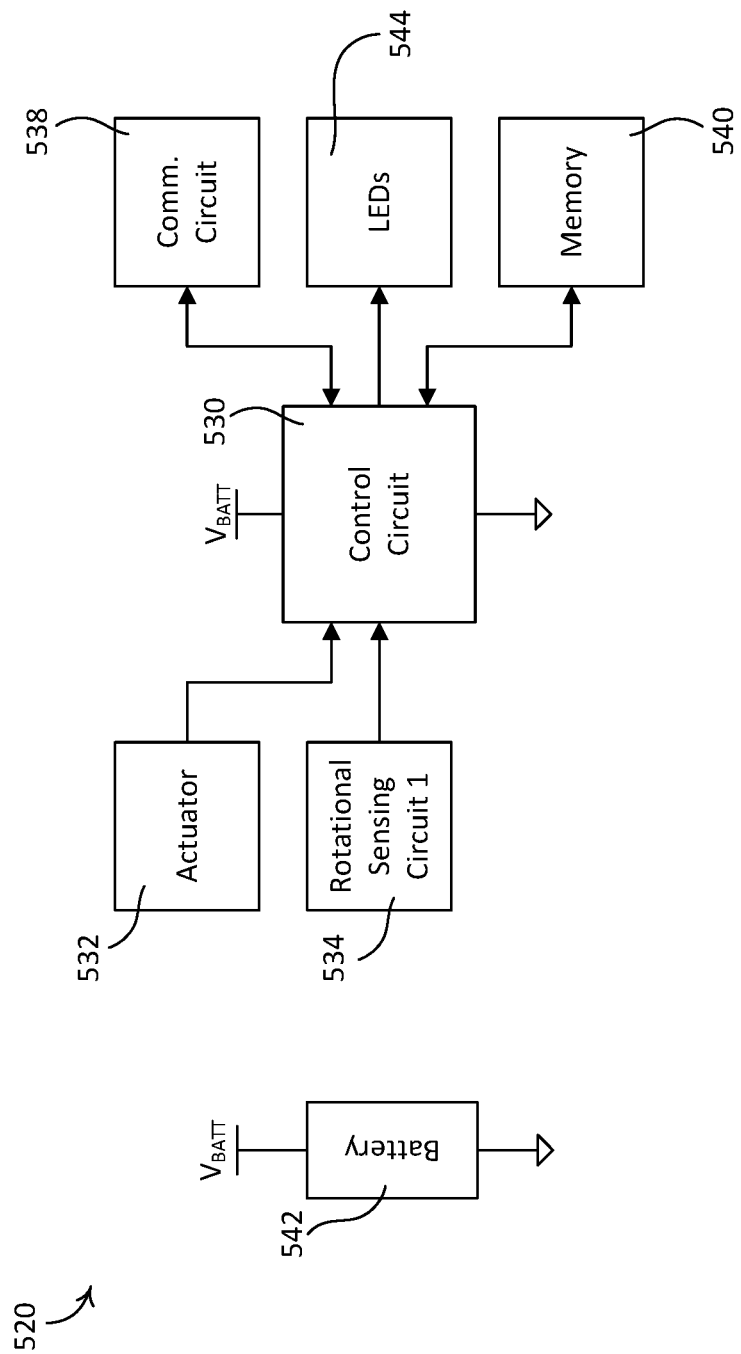
FIG. 5 shows a simplified block diagram of an example control device that may be deployed as a remote control device of the load control system illustrated in FIG. 1.

FIG. 5 is a simplified block diagram of an example control device 500 (e.g., a remote control device), which may be deployed as the remote control devices 112-118 in the lighting control system 100, the control device 200, and/or the remote control devices 310. The control device 500 may include a control circuit 530, one or more actuators 532 (e.g., buttons and/or switches), a rotational sensing circuit 534, a wireless communication circuit 538, a memory 540, a battery 542, and/or one or more LEDs 544. The memory 540 may be configured to store one or more operating parameters (e.g., such as a preconfigured color scene or a preset light intensity) of the control device 500. The battery 542 may provide power to one or more of the components shown in FIG. 5.

The one or more actuators 532 may include a button or switch (e.g., a mechanical button or switch, or an imitation thereof) such as those described in association with the actuation portion 216 of the control device 200 and/or the actuation portion 334 of the remote control device 310. The actuators 532 may be configured to send respective input signals to the control circuit 530 in response to actuations of the actuators 532 (e.g., in response to movements of the actuators 532). The rotational sensing circuit 534 may be configured to translate a force applied to a rotating mechanism (e.g., such as the rotating portion 214 of the control device 200 and/or the rotating portion 334 of the remote control device 310) into an input signal and provide the input signal to the control circuit 530. The rotational sensing circuit 534 may include, for example, one or more magnetic sensors (such as Hall-effect sensors (HES), tunneling magnetoresistance (TMR) sensors, anisotropic magnetoresistance (AMR) sensors, giant magnetoresistance (GMR) sensors, reed switches, or other mechanical magnetic sensors), a mechanical encoder, an optical encoder, and/or a potentiometer (e.g., a polymer thick film or other resistive trace on a printed circuit board).

The control circuit 530 may be configured to translate the input signals provided by the actuators 534 and/or the rotational sensing circuit 534 into control data (e.g., digital control signals) for controlling one or more electrical loads. The control circuit 530 may cause the control data (e.g., digital control signals) to be transmitted to the electrical loads via the wireless communication circuit 538. For example, the wireless communication circuit 538 may transmit a control signal including the control data to the one or more electrical loads or to a central controller of the concerned load control system. The control circuit 530 may transmit a control signal including control data for turning one or more lighting loads on or off in response to an actuation of one of the actuators 534. The control circuit 530 may transmit one or more control signals including control data for adjusting the intensities of one or more lighting loads in response to rotations of the rotating mechanism determined from the rotational sensing circuit 534. The control circuit 530 may transmit one or more control signals including control data for adjusting the color (e.g., the color temperature) of one or more lighting loads in response to rotations of the rotating mechanism while one of the actuators 534 is being actuated.

The control circuit 530 may illuminated the LEDs 544 to present a light bar (e.g., such as the light bar 218 and/or the light bar 336) and/or one or more indicator lights to provide feedback about various conditions. When the control circuit 530 is transmitting control signals including control data for adjusting the intensities of one or more lighting loads, the control circuit may control the LEDs 544 to illuminate the light bar (e.g., illuminated in a single color, such as white) to display feedback information regarding the present intensity of one or more of the lighting loads. When the control circuit 530 is transmitting control signals including control data for adjusting the color of one or more lighting loads, the control circuit may control the LEDs 544 to illuminate the light bar with one or more colors to provide feedback of the present color of one or more of the lighting loads.

Figure 6:
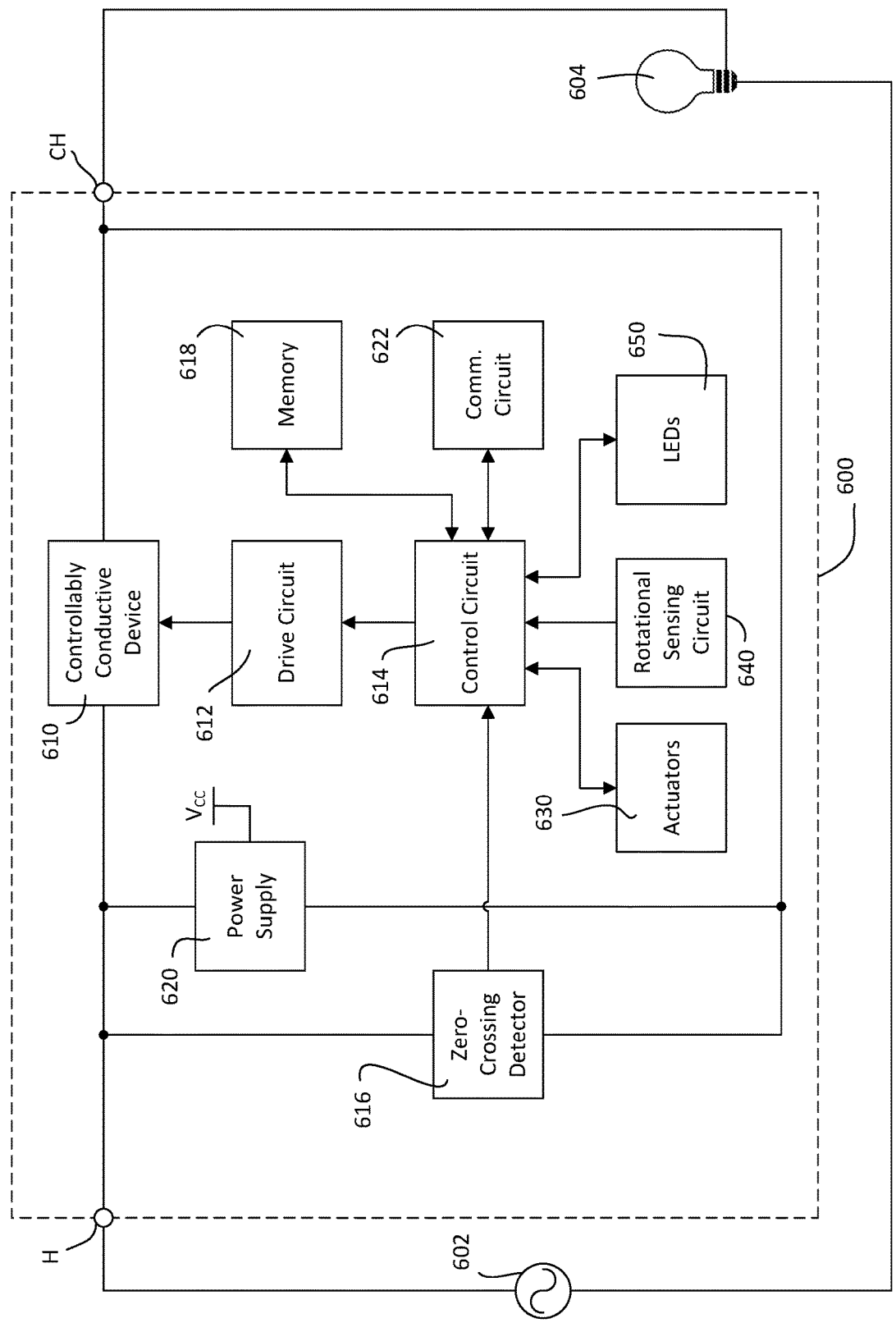
FIG. 6 shows a simplified block diagram of an example control device that may be deployed as a load control device (e.g., a dimmer switch) of the load control system illustrated in FIG. 1.

FIG. 6 is a simplified block diagram of an example control device 600 (e.g., a dimmer switch) that may be deployed as, for example, the dimmer switch 110 of the lighting control system 100 and/or the control device 200. The control device 600 may include a hot terminal H that may be adapted to be coupled to an AC power source 602. The control device 600 may include a controlled hot terminal CH (e.g., a switched hot and/or a dimmed hot terminal) that may be adapted to be coupled to an electrical load, such as a lighting load 604. The control device 600 may include a controllably conductive device 610 coupled in series electrical connection between the AC power source 602 and the lighting load 604. The controllably conductive device 610 may control the power delivered to the lighting load. The controllably conductive device 610 may include a relay and/or a bidirectional semiconductor switch, such as, for example, a triac, a field-effect transistor (FET) in a rectifier bridge, two FETs in anti-series connection, one or more insulated-gate bipolar junction transistors (IGBTs), or other suitable semiconductor switching circuit.

The control device 600 may include a control circuit 614. The control circuit 614 may include one or more of a processor (e.g., a microprocessor), a microcontroller, a programmable logic device (PLD), a field programmable gate array (FPGA), an application specific integrated circuit (ASIC), or any suitable controller or processing device. The control circuit 614 may be operatively coupled to a control input of the controllably conductive device 610, for example, via a gate drive circuit 612. The control circuit 814 may be used for rendering the controllably conductive device 610 conductive or non-conductive, for example, to turn the lighting load 604 on and off and/or to control the amount of power delivered to the lighting load 604.

The control circuit 614 may receive a control signal representative of the zero-crossing points of the AC main line voltage of the AC power source 602 from a zero-crossing detector 616. The control circuit 614 may be operable to render the controllably conductive device 610 conductive and/or non-conductive at predetermined times relative to the zero-crossing points of the AC waveform using a phase-control dimming technique. Examples of dimmers are described in greater detail in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR-CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The control device 600 may include a memory 618. The memory 618 may be communicatively coupled to the control circuit 814 for the storage and/or retrieval of, for example, operational settings, such as, lighting presets and associated preset light intensities. The memory 618 may be implemented as an external integrated circuit (IC) or as an internal circuit of the control circuit 614. The control device 600 may include a power supply 620. The power supply 620 may generate a direct-current (DC) supply voltage $V_{CC}$ for powering the control circuit 614 and the other low-voltage circuitry of the control device 600. The power supply 620 may be coupled in parallel with the controllably conductive device 610. The power supply 620 may be operable to conduct a charging current through the lighting load 804 to generate the DC supply voltage $V_{CC}$.

The control circuit 614 may be responsive to inputs received from one or more of the actuators 630 and/or a rotational sensing circuit 640. The control circuit 614 may control the controllably conductive device 610 to turn the lighting load 604 on and off, adjust the intensity of the lighting load, and/or adjust the color of the lighting load in response to the inputs received via the actuators 630 and/or the rotational position sensing circuit 640. The actuators 630 may include a button or switch (e.g., a mechanical button or switch, or an imitation thereof) such as those described in association with the actuation portion 216 of the control device 200 and/or the actuation portion 334 of the remote control device 310. The actuators 630 may be configured to send respective input signals to the control circuit 614 in response to actuations of the actuators 630.

The rotary position sensing circuit 640 may be configured to translate a force applied to a rotating mechanism (e.g., such as the rotating portion 214 of the control device 200 and/or the rotating portion 332 of the remote control device 310) into an input signal and provide the input signal to the control circuit 614. The rotational position sensing circuit 640 may include, for example, one or more magnetic sensors (such as Hall-effect sensors (HES), tunneling magnetoresistance (TMR) sensors, anisotropic magnetoresistance (AMR) sensors, giant magnetoresistance (GMR) sensors, reed switches, or other mechanical magnetic sensors), a mechanical encoder, and/or an optical encoder.

The control device 600 may comprise a communication circuit 622. The communication circuit 622 may comprise a wireless communication circuit, for example, a radio-frequency (RF) transceiver coupled to an antenna for transmitting and/or receiving RF signals, an RF transmitter for transmitting RF signals, an RF receiver for receiving RF signals, or an infrared (IR) transmitter and/or receiver for transmitting and/or receiving IR signals. The communication circuit 622 may also comprise a wired communication circuit configured to be coupled to a wired control link, for example, a digital communication link and/or an analog control link, such as a 0-10V control link or a pulse-width modulated (PWM) control link. In addition, the communication circuit 622 may be coupled to the electrical wiring between the control device 600 and the lighting load 604 and may be configured to transmit a control signal to the lighting load 604 via the electrical wiring using, for example, a power-line carrier (PLC) communication technique.

The communication circuit 622 may be configured to transmit a control signal that includes the control data (e.g., a digital message) generated by the control circuit 614 to the lighting load 604. As described herein, the control data may be generated in response to a user input to adjust one or more operational aspects of the lighting load 604. The control data may include a command and/or identification information (e.g., such as a unique identifier) associated with the control device 600. In addition to or in lieu of transmitting the control signal to the lighting load 604, the communication circuit 622 may be controlled to transmit the control signal to a central controller of the lighting control system.

The control circuit 614 may be configured to turn the lighting load on and off by rendering the controllably conductive device 610 conductive and non-conductive in response to an actuation of one of the actuators 630. The control circuit 614 may be configured to transmit digital messages to the lighting load 604 via the communication circuit 622 for adjusting the intensity of the lighting load in response to rotations of the rotating mechanism determined from the rotational sensing circuit 640. In addition, the control circuit 614 may be configured to control the controllably conductive device 610 using the phase control technique to adjust the intensity of the lighting load in response to rotations of the rotating mechanism determined from the rotational sensing circuit 640. The control circuit 614 may be configured to transmit digital messages to the lighting load 604 via the communication circuit 622 for adjusting the color of the lighting load in response to rotations of the rotating mechanism while one of the actuators 630 is being actuated.

The control circuit 614 may be configured to illuminate one or more light sources, e.g., LEDs 650, to provide feedback of a status of the lighting load 604, to indicate a status of the control device 600, and/or to assist with a control operation (e.g., to provide a color gradient for controlling the color of the lighting load 604, etc.). The LEDs 650 may be configured to illuminate one or more visual indicators, such as a light bar (e.g., the light bar 218 and/or the light bar 336), to serve as indicators of various conditions. When the rotating mechanism is being rotated to adjust the intensity of the lighting load 604, the control circuit 614 may control the LEDs 650 to illuminate the light bar (e.g., illuminated in a single color, such as white) to display feedback information regarding the present intensity of the lighting load 604. When the rotating mechanism is being rotated while one of the actuators 630 is being actuated in order to adjust the color of the lighting load 604, the control circuit 614 may control the LEDs 650 to illuminate the light bar with one or more colors to provide feedback of the present color of the lighting load 604.

Figure 7:
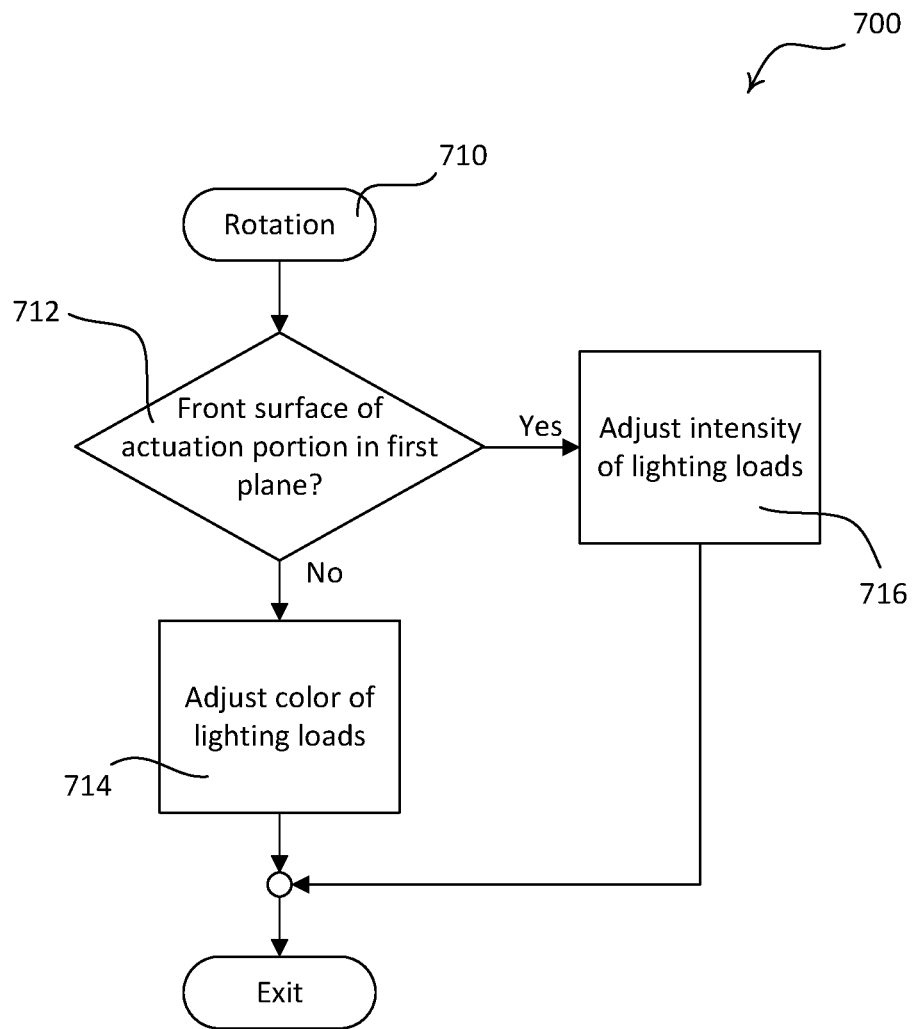
FIG. 7 shows a simplified flowchart of an example control procedure that may be executed by a control device for controlling multiple characteristics of an electrical load.

FIG. 7 shows a simplified flowchart of an example control procedure 700 that may be executed by a control circuit of a control device (e.g., the control circuit 530 of the control device 500 and/or the control circuit 614 of the control device 600) for controlling multiple characteristics of an electrical load, such as a lighting load. The control procedure 700 may begin at 710 when rotation of a rotating mechanism (e.g., the rotating portion 214 of the control device 200 and/or the rotating portion 332 of the remote control device 310) is detected via a rotational sensing circuit (e.g., the rotational sensing circuit 534 and/or the rotational sensing circuit 640). In response to the rotation, the control circuit may determine whether the front surface of an actuation mechanism (e.g., the actuation portion 216 and/or the actuation portion 334) is in a first plane along an axis perpendicular to a base portion of the control device. The determination may be made, for example, based on the state of a switch (e.g., whether the switch is actuated, whether the switch is open or closed, etc.) included in the control device. The determination may also be made via a sensor (e.g., a light emitting diode (LED) sensor), a photosensitive device, an optocoupler that comprises an infra-red (IR) light emitting diode (LED) and a photodiode, an inductive sensor, a hall-effect sensor circuit, a manually operated switch, and/or the like, as described above.

If the control circuit determines that the front surface of the rotating mechanism is presently in the first plane at 712, the control circuit may adjust the intensity of the lighting load (e.g., by directly controlling a controllably conductive device and/or by transmitting one or more digital messages) at 714, before the control procedure 700 exits. If the control circuit determines that the front surface of the actuation mechanism is presently not in the first plane at 712 while the rotating mechanism is being rotated, the control circuit may adjust the color of the lighting load (e.g., by directly controlling a controllably conductive device and/or by transmitting one or more digital messages) at 716, before the control procedure 700 exits.

Although described with reference to color and intensity, the control circuit (e.g., via the control procedure 700) may generate control signals for adjusting any type of characteristic of an electrical load in response to a rotation of the rotating mechanism when the rotating mechanism is in a particular plane. For example, the characteristics may be any of intensity, color (e.g., color temperature), volume, music selection, HVAC mode (e.g., AC on/off, heat on/off, temperature, fan speed, etc.), ceiling fan speed, relative height/location of a motorized window treatment, or any of adjustable characteristics of the electrical loads described herein. Further, although described with reference to controlling a single electrical load, the control circuit may be configured to control a characteristic of one or more electricals load in response to a rotation of the rotating mechanism in the first plane, and another potentially different characteristic of one or more potentially different electrical loads in response to a rotation of the rotating mechanism in the second plane (e.g., and a third characteristic of one or more potentially different electrical loads in response to a rotation of the rotating mechanism in the third plane, etc.).

The invention claimed is:

1. A control device configured for use in a load control system to control one or more electrical loads external to the control device, the control device comprising:
   a base portion configured to be mounted to an electrical wallbox or over a mechanical switch;
   a rotating portion rotatable with respect to the base portion;
   an internal switch;
   an actuation portion comprising a front surface, the actuation portion configured to not actuate the internal switch when the front surface of the actuation portion is in a first plane and to actuate the internal switch when the front surface of the actuation portion is moved into a second plane parallel to the first plane; and
   a control circuit configured to generate first control data for changing a first characteristic of the one or more electrical loads in response to detecting that the rotating portion is being rotated and the internal switch is not being actuated while the front surface of the actuation portion is located in the first plane, the control circuit further configured to generate second control data for changing a second characteristic of the one or more electrical loads in response to detecting that the rotating portion is being rotated and the internal switch is being actuated while the front surface of the actuation portion is located in the second plane and the internal switch is being actuated.

2. The control device of claim 1, wherein the control circuit is configured to generate the first control data for adjusting an intensity of the one or more electrical loads in response to detecting that the rotating portion is being rotated and the internal switch is not being actuated while the front surface of the actuation portion is located in the first plane, the control circuit further configured to generate the second control data for changing a color of the one or more electrical loads in response to detecting that the rotating portion is being rotated and the internal switch is being actuated while the front surface of the actuation portion is located in the second plane and the internal switch is being actuated.

3. The control device of claim 2, further comprising:
   one or more visual indicators configured to be illuminated by one or more light sources.

4. The control device of claim 3, wherein, when the rotating portion is being rotated to adjust the intensity of the one or more electrical loads, the control circuit is configured to illuminate the one or more visual indicators to display feedback information regarding a present intensity of the one or more electrical loads.

5. The control device of claim 3, wherein, when the rotating portion is being rotated to adjust the color of the one or more electrical loads, the control circuit is configured to illuminate the one or more visual indicators to display feedback information regarding a present color of the one or more electrical loads.

6. The control device of claim 1, wherein the second plane is located closer to the base portion than the first plane, and the front surface of the actuation portion is configured to be moved from the first plane to the second plane when the rotating portion is pushed in towards the base portion.

7. The control device of claim 1, wherein the second plane is located farther away from the base portion than the first plane, and the front surface of the actuation portion is configured to be moved from the first plane to the second plane when the rotating portion is pulled away from the base portion.

8. The control device of claim 1, wherein, once in the second plane, the front surface of the actuation portion is configured to be maintained in the second plane without an external force.

9. The control device of claim 1, wherein, once in the second plane, the front surface of the actuation portion is configured to be biased back towards the first plane without an external force and to stay in the second plane while the external force is applied.

10. The control device of claim 1, wherein the actuation portion is attached to the rotating portion.

11. The control device of claim 1, wherein the actuation portion is separate from the rotating portion and received in a central opening of the rotating portion.

12. The control device of claim 1, further comprising:
a communication circuit configured to transmit a first control signal associated with the first control data and a second control signal associated with the second control data.

13. The control device of claim 1, further comprising:
a load control circuit adapted to be electrically coupled in series between an AC power source and the one or more electrical loads for controlling power delivered to the one or more electrical loads.

14. The control device of claim 1, wherein the control device is configured to be mounted over a toggle actuator of the mechanical switch that controls whether power is delivered to the one or more electrical loads.

15. A control device configured for use in a load control system to control one or more electrical loads external to the control device, the control device comprising:
a base portion configured to be mounted to an electrical wallbox or over a mechanical switch;
an internal switch;
a rotating portion rotatable with respect to the base portion, the rotating portion comprising a front area, the rotating portion configured to not actuate the internal switch when the front area of the rotating portion is located in a first plane and to actuate the internal switch when the front area of the rotating portion is moved into a second plane parallel to the first plane; and
a control circuit configured to generate first control data for changing an intensity of the one or more electrical loads in response to detecting that the rotating portion is being rotated and the internal switch is not being actuated while the front area of the rotating portion is located in the first plane, the control circuit further configured to generate second control data for changing a color of the one or more electrical loads in response to detecting that the rotating portion is being rotated and the internal switch is actuated while the front area of the rotating portion is located in the second plane and the internal switch is being actuated.

16. The control device of claim 15, further comprising:
an actuation portion comprising a front surface that defines the front area of the rotating portion.

17. The control device of claim 16, wherein the actuation portion is attached to the rotating portion.

18. The control device of claim 16, wherein the actuation portion is separate from the rotating portion and received in a central opening of the rotating portion.

19. The control device of claim 15, wherein the second plane is located closer to the base portion than the first plane, and the front area of the rotating portion is capable of being moved from the first plane to the second plane when the rotating portion is pushed in towards the base portion.

20. The control device of claim 15, wherein the second plane is located farther away from the base portion than the first plane, and the front area of the rotating portion is capable of being moved from the first plane to the second plane when the rotating portion is pulled away from the base portion.

21. A control device for controlling an electrical load in a load control system, the control device comprising:
a base portion configured to be mounted over an actuator of a mechanical switch that controls power delivered to the electrical load;
a rotating portion rotatable with respect to the base portion;
an internal switch;
an actuation portion having a front surface, the actuation portion configured to not actuate the internal switch when the front surface of the actuation portion is in a first plane along an axis perpendicular to the base portion, the actuation portion further configured to actuate the internal switch when the front surface of the actuation portion is moved into a second plane parallel to the first plane; and
a control circuit configured to generate first control data for changing an intensity of the electrical load in response to rotations of the rotating portion when the front surface of the actuation portion is located in the first plane and the internal switch is not actuated, the control circuit further configured to generate second control data for changing a color of the electrical load in response to rotations of the rotating portion when the front surface of the actuation portion is in the second plane and the internal switch is actuated.

* * * * *